US012206437B2

(12) United States Patent
Sim et al.

(10) Patent No.: US 12,206,437 B2
(45) Date of Patent: Jan. 21, 2025

(54) TIME-DIVISION MULTIPLEXING-BASED MULTI-CHANNEL ELECTROCARDIOGRAM MEASUREMENT APPARATUS ROBUST AGAINST POWER LINE INTERFERENCE AND ELECTROCARDIOGRAM MEASUREMENT METHOD USING THE SAME

(71) Applicant: POSTECH ACADEMY-INDUSTRY FOUNDATION, Pohang-si (KR)

(72) Inventors: Jae Yoon Sim, Pohang-si (KR); Kyu Jin Choi, Pohang-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 191 days.

(21) Appl. No.: 17/988,696

(22) Filed: Nov. 16, 2022

(65) Prior Publication Data
US 2024/0120938 A1  Apr. 11, 2024

(30) Foreign Application Priority Data

Oct. 5, 2022 (KR) .......................... 10-2022-0127152

(51) Int. Cl.
*H03M 3/00* (2006.01)
*H03M 1/80* (2006.01)

(52) U.S. Cl.
CPC ........... *H03M 3/474* (2013.01); *H03M 1/802* (2013.01)

(58) Field of Classification Search
CPC ..... H03M 3/474; H03M 1/802; A61B 5/0484; A61B 5/04085; A61B 5/0428
See application file for complete search history.

(56) References Cited

U.S. PATENT DOCUMENTS

| 10,827,940 | B2 | 11/2020 | Goldminz et al. |
| 11,129,559 | B2* | 9/2021 | Matthiesen ........ A61B 18/1233 |
| 2016/0249846 | A1* | 9/2016 | Yoo ........................ G16H 50/20 |
| | | | 600/544 |
| 2020/0315480 | A1* | 10/2020 | Hwang .................... A61B 5/30 |

FOREIGN PATENT DOCUMENTS

| CN | 111417434 A | 7/2020 |
| JP | 2011156194 A | 8/2011 |
| KR | 10-2184930 B1 | 12/2020 |
| KR | 10-2269411 B2 | 6/2021 |
| KR | 20210158696 A | 12/2021 |

* cited by examiner

*Primary Examiner* — Joseph J Lauture
(74) *Attorney, Agent, or Firm* — Morgan, Lewis & Bockius LLP

(57) ABSTRACT

The present disclosure relates to a time-division multiplexing (TDM)-based multi-channel electrocardiogram measurement apparatus and method, which remove the influence of power line interference in a way to implement multiple channels by using a TDM method, remove an electrode DC offset (EDO) through a pre-charged capacitor, and periodically take a current out or supply a current. The TDM-based multi-channel electrocardiogram measurement apparatus and method robust against power line interference according to the present disclosure have advantages in that it can measure electrocardiogram by using multiple channels with low power and high integration based on TDM, can perform contactless measurement because an EDO is efficiently eliminated and high impedance is satisfied, and has a characteristic robust against power line interference.

12 Claims, 2 Drawing Sheets

TIME-DIVISION MULTIPLEXING-BASED MULTI-CHANNEL ELECTROCARDIOGRAM MEASUREMENT APPARATUS ROBUST AGAINST POWER LINE INTERFERENCE AND ELECTROCARDIOGRAM MEASUREMENT METHOD USING THE SAME

BACKGROUND

1. Technical Field

The present disclosure relates to an electrocardiogram measurement apparatus and method, and more particularly, to a time-division multiplexing (TDM)-based multi-channel electrocardiogram measurement apparatus robust against power line interference, which removes the influence of power line interference in a way to implement multiple channels by using a TDM method, remove an electrode DC offset (EDO) through a pre-charged capacitor, and periodically take a current out or supply a current, and an electrocardiogram measurement method using the same.

2. Related Art

A cardiovascular disease is one of major causes of death, which occupies 33% of causes of death worldwide. The cardiovascular disease, that is, heart disease, may be diagnosed through electrocardiogram measurement for detecting an electrical signal that is generated due to the movement of the heart.

Electrocardiogram (hereinafter referred to as "ECG") is to measure and record an electrical activity current according to the contraction and extension of cardiac muscle. An action potential that is generated when cardiac muscle is contracted and released refers to a current that is spread from the heart to the entire body. The current generates a potential difference depending on a state of the body. The potential difference is detected through a surface electrode that is attached to the skin of the human body. Such electrocardiogram is used to check whether the heart is normal or abnormal, and is an index that is basically considered in diagnosing cardiovascular diseases, such as angina, myocardial infarction, and arrhythmia.

In order to accurately diagnose and measure a cardiovascular disease, 12-lead electrocardiogram needs to be basically measured in a hospital, and electrocardiogram using at least eight channels needs to be measured. That is, there is a need for a technology capable of implementing the measurement of electrocardiogram using multiple channels.

In order to measure electrocardiogram, an electrode needs to be attached to the body. In a process of attaching the electrode to the body, there is a problem in that an offset of a channel electrode (i.e., an electrode DC offset, hereinafter referred to as an "EDO") occurs at a contact surface between the electrode and the body.

In order to measure electrocardiogram using multiple channels as described above, conventionally, a frequency-division multiplexing (hereinafter referred to as "FDM") method of implementing the measurement of electrocardiogram using multiple channels through upward modulation in a different frequency band for each channel and a time-division multiplexing (hereinafter referred to as "TDM") method of uniformly distributing a measurement time for each channel have been used.

However, the FDM method does not have an advantage of lower power or high integration because several local oscillators and amplifiers are required, and has a disadvantage in that contactless measurement is impossible because passive mixing for upward modulation greatly reduces input resistance. Furthermore, the FDM method has a problem in that pieces of unique input impedance between the channels are mismatched due to a difference between upward modulation frequencies.

In the TDM method, a single amplifier is shared through time interleaving while sacrificing a maximum sampling speed of each channel. However, the TDM method has a disadvantage in that contactless measurement is impossible because a large parallel capacitor of a capacitor digital-to-analog converter (CDAC) that is present at the front stage of the single amplifier in order to remove the EDO of each channel eventually reduces impedance.

In an electrocardiogram measurement apparatus using multiple channels, interference attributable to a power line occurs. Conventionally, in order to suppress such power line interference, not an electrode for electrocardiogram measurement, but an additional electrode is used. Furthermore, a switched capacitor method of letting a current flow by using a capacitor and a continuous charge pump method of letting a current flow by using a MOSFET in order to suppress power line interference are used.

However, the switched capacitor method has problems in that as the number of channels is increased, capacitors and controllers that are used occupy a large area and thus great power consumption is caused. In the continuous charge pump method, several amplifiers need to be used in order to apply the continuous charge pump method to a multi-channel implementation method because the charge pump is controlled by monitoring the output of the amplifier. Accordingly, the continuous charge pump method has disadvantages in terms of the area and power consumption.

SUMMARY

Various embodiments are directed to providing a TDM-based multi-channel electrocardiogram measurement apparatus robust against power line interference, which removes the influence of power line interference in a way to implement multiple channels by using the TDM method, remove an EDO through a pre-charged capacitor, and periodically take a current out or supply a current.

Also, various embodiments are directed to providing an electrocardiogram measurement method capable of measuring electrocardiogram in a TDM manner by using first to fourth phase signals.

In an embodiment, a time-division multiplexing (TDM)-based multi-channel electrocardiogram measurement apparatus robust against power line interference includes a multi-channel measurement unit including a plurality of electrocardiogram measurement channels and configured to measure electrocardiogram of the plurality of electrocardiogram measurement channels by using a TDM method, a channel electrode offset (EDO) elimination unit configured to eliminate an EDO occurring in the multi-channel measurement unit, a common mode interference cancellation unit configured to cancel interference attributable to a power line around the body, an instrumentation amplifier configured to amplify an output signal of the multi-channel measurement unit, and an analog-to-digital converter configured to convert an analog signal of the instrumentation amplifier into a digital signal.

In an embodiment, an electrocardiogram measurement method includes a common mode detection step of detecting a common mode voltage at the input stage of the instrumentation amplifier by using a first phase signal, a charge pump unit driving step of driving the charge pump unit by using a second phase signal when a value of the common mode voltage at the input stage of the instrumentation amplifier is greater than a predetermined operating range, an EDO elimination step of eliminating an EDO through the EDO elimination unit by using a third phase signal, and an electrocardiogram measurement step of measuring electrocardiogram of the plurality of electrocardiogram measurement channels by using a fourth phase signal.

According to the TDM-based multi-channel electrocardiogram measurement apparatus robust against power line interference according to the present disclosure, electrocardiogram can be measured by using multiple channels with low power and high integration based on TDM, and contactless measurement is possible because an EDO is efficiently eliminated and high impedance is satisfied.

Furthermore, the TDM-based multi-channel electrocardiogram measurement apparatus has an advantage in that it has a characteristic robust against power line interference while not reducing input impedance by using a method of periodically taking a current out or supplying a current so that a common mode voltage at the input stage of the amplifier falls within an operating range.

DETAILED DESCRIPTION

Hereinafter, embodiments of the present disclosure are described in detail with reference to the accompanying drawings.

Figure 1:
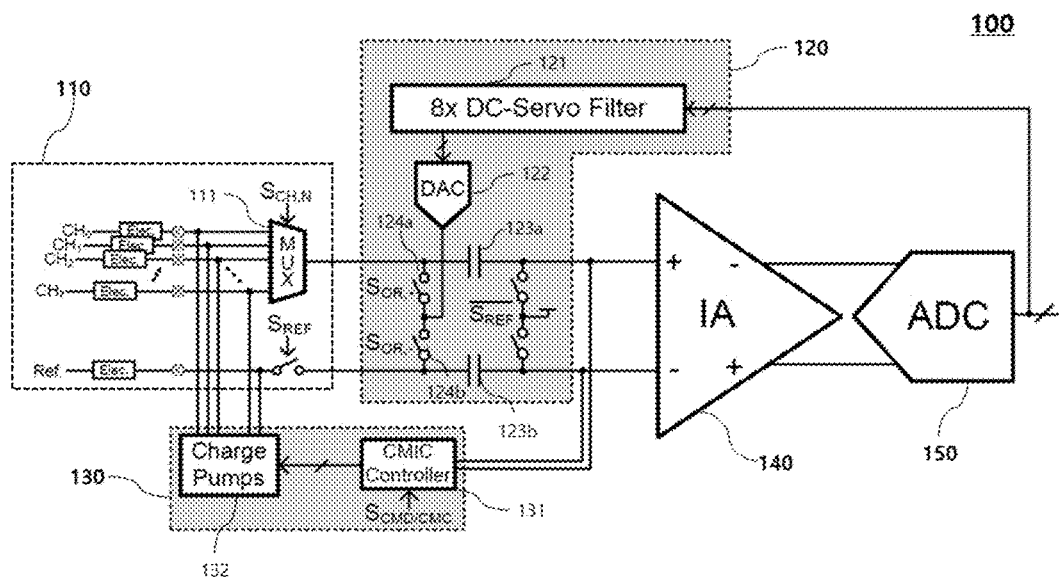
FIG. 1 is a diagram illustrating a TDM-based multi-channel electrocardiogram measurement apparatus robust against power line interference according to the present disclosure.

FIG. 1 is a diagram illustrating a TDM-based multi-channel electrocardiogram measurement apparatus robust against power line interference according to the present disclosure.

As illustrated in FIG. 1, a TDM-based multi-channel electrocardiogram measurement apparatus 100 robust against power line interference according to the present disclosure includes a multi-channel measurement unit 110, an EDO elimination unit 120, a common mode interference cancellation unit 130, an instrumentation amplifier 140, and an analog-to-digital converter (ADC) 150.

Electrocardiogram has a frequency band of 0.1 to 150 hertz (Hz), and has the size of a signal of about 3 mV". Accordingly, after the size of the signal is amplified through the instrumentation amplifier 140 that is a low-noise amplifier, digital data of electrocardiogram may be read from the outside or used through the ADC 150 that is a converter.

The multi-channel measurement unit 110 includes eight electrocardiogram measurement channels $CH_0$ to $CH_7$, a reference channel Ref, and a multiplexer (MUX) 111 for 12-lead electrocardiogram measurement.

The TDM-based multi-channel electrocardiogram measurement apparatus 100 robust against power line interference according to the present disclosure uses the MUX 111 in order to perform 12-lead 8-channel electrocardiogram measurement with low power and high integration. Accordingly, only one instrumentation amplifier 140 and one ADC 150 may be used.

Electrocardiogram is measured by placing the reference channel Ref at one place of the body, for example, at a left leg part and placing the electrocardiogram measurement channels $CH_0$ to $CH_7$ at eight different locations of the body. In this case, an EDO, that is, a voltage offset, is present at each location at which electrocardiogram is measured on the basis of the left leg. If the EDO is not eliminated, electrocardiogram cannot be accurately measured because the instrumentation amplifier 140 malfunctions.

The EDO elimination unit 120 is disposed between the multi-channel measurement unit 110 and the instrumentation amplifier 140, and includes a DC-servo filter 121, a digital-to-analog converter (DAC) 122, an upper capacitor 123a and a lower capacitor 123b that are coupling capacitors, and an upper switch 124a and a lower switch 124b that are coupling switches.

The DC-servo filter 121 receives the output of the ADC 150 as an input, and transmits, to the DAC 122, a code that includes information corresponding to an EDO.

Prior to channel measurement, the upper capacitor 123a and the lower capacitor 123b are previously charged with voltages having a difference corresponding to an EDO of a channel to be measured in response to a switching operation of the upper switch 124a and the lower switch 124b. Accordingly, accurate electrocardiogram measurement is made possible because only an electrocardiogram signal from which an EDO has been eliminated reaches the input of the instrumentation amplifier 140. Since a previously charged current value is different for each channel, the channel may be charged with a voltage having a value corresponding to an EDO prior to channel measurement.

In a conventional TDM-based EDO elimination circuit, a DC offset is eliminated by using a capacitor connected to a coupling capacitor in parallel. However, elements that are connected to a part at which a signal is input in parallel act as a major cause to reduce input impedance. In contrast, the EDO elimination unit 120 of the TDM-based multi-channel electrocardiogram measurement apparatus robust against power line interference according to the present disclosure has an advantage in that it can satisfy high input impedance because parallel elements can be minimized.

Power line interference occurs due to a power line around the body. The body plays a role as one antenna, and thus a great sine wave of 60 Hz that is generated from the power line is input to a circuit as a common mode (CM) current. Accordingly, a malfunction of the instrumentation amplifier is caused.

Accordingly, there is a need for an operation of previously detecting the influence of power line interference periodically before the instrumentation amplifier malfunctions and inputting a current to the body or taking a current out from the body if a common mode voltage of the instrumentation amplifier does not fall within an operating range due to an interference current as a result of the detection. That is, the instrumentation amplifier may be designed to be robust against power line interference in a way to periodically take a current out or supply a current so that a common mode voltage at the input stage of the instrumentation amplifier operates within the operating range.

The common mode interference cancellation unit 130 includes a common mode interference cancellation (CMIC) controller 131 and a charge pump unit 132. The CMIC controller 131 receives a signal from which an EDO has been eliminated through the EDO elimination unit 120 and that is transmitted to the input stage of the instrumentation amplifier 140, detects a common mode voltage in the signal, and drives the charge pump unit 132 when a value of the detected common mode voltage is greater than a previously permitted range.

The common mode interference cancellation unit 130 does not consistently operate, but operates for only permitted timing. That is, the common mode interference cancellation unit 130 does not reduce input impedance of an electrocardiogram signal because the common mode interference cancellation unit 130 operates only in a preparation step between channel measurements. A total of nine charge pumps of the charge pump unit 132 let an interference current attributable to a power line flow previously by discretely operating in such a manner so that the instrumentation amplifier 140 does not malfunction.

Accordingly, there is an effect in that power line interference can be suppressed even without an additional electrode, unlike a conventional method of using an additional electrode not an electrode for electrocardiogram measurement in order to suppress power line interference.

The output of the ADC 150 is used to drive the EDO elimination unit 120 through control of timing interleaving.

As described above, the TDM-based multi-channel electrocardiogram measurement apparatus 100 robust against power line interference according to the present disclosure is effective in implementing a low power and high integration circuit because the pair of coupling capacitors 123a and 123b, the EDO elimination unit 120, the common mode interference cancellation unit 130, the instrumentation amplifier 140, the ADC 150, etc. are shared.

Figure 2:
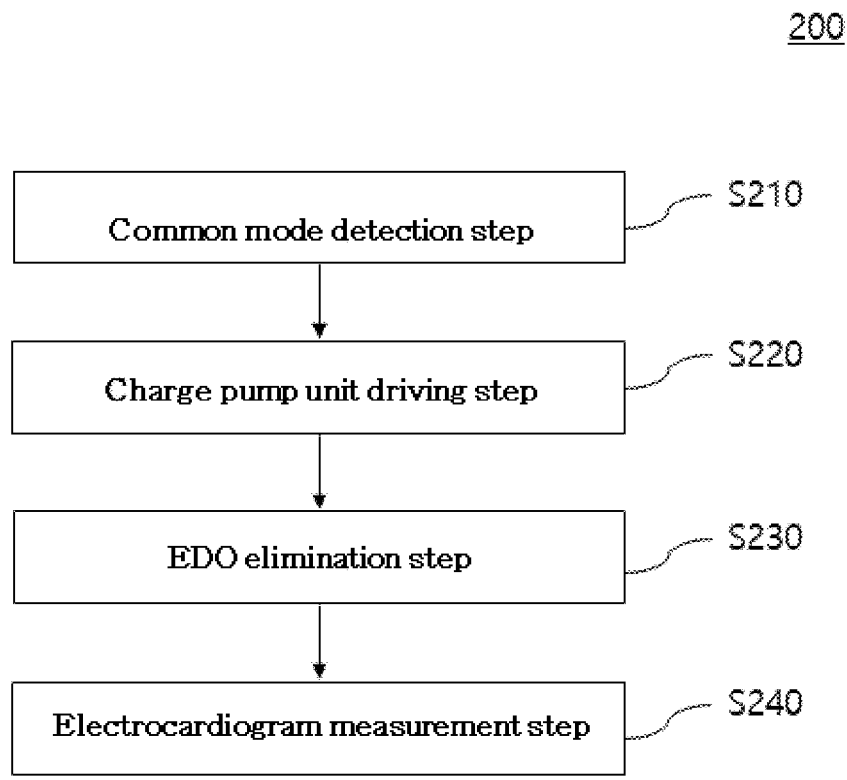
FIG. 2 is a flowchart of an electrocardiogram measurement method according to the present disclosure.
Figure 3:
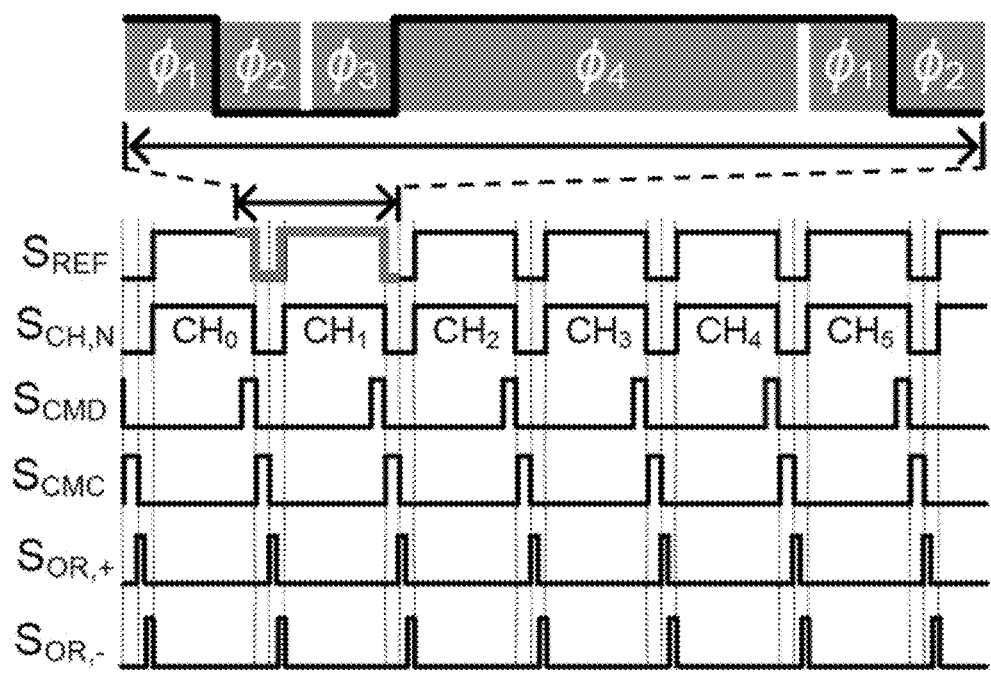
FIG. 3 is a timing diagram for TDM control in the electrocardiogram measurement method according to the present disclosure.

FIG. 2 is a flowchart of an electrocardiogram measurement method according to the present disclosure. FIG. 3 is a timing diagram for TDM control in the electrocardiogram measurement method according to the present disclosure.

Referring to FIGS. 2 and 3, an electrocardiogram measurement method 200 according to the present disclosure includes a common mode detection step S210, a charge pump unit driving step S220, an EDO elimination step S230, and an electrocardiogram measurement step S240.

In the common mode detection step S210, a common mode voltage at the input stage of the instrumentation amplifier is detected by using a first phase signal $\varphi_1$. In this case, the first phase signal $\varphi_1$ is a phase signal for the CMIC controller 131 for detecting an input common mode voltage in response to a common mode detection signal $S_{CMD}$.

That is, in the common mode detection step S210, when receiving the first phase signal $\varphi_1$, the CMIC controller 131 detects the common mode voltage in a signal transferred to the input stage of the instrumentation amplifier 140 in response to the common mode detection signal $S_{CMD}$, and outputs a common mode interference cancellation control signal when a value of the common mode voltage is greater than a predetermined operating range.

In the charge pump unit driving step S220, the charge pump unit 132 is driven by using a second phase signal $\varphi_2$ when the value of the common mode voltage at the input stage of the instrumentation amplifier is greater than the predetermined operating range. The second phase signal $\varphi_2$ is a phase signal for driving the charge pump unit 132 in response to a common mode control signal $S_{CMC}$.

That is, in the charge pump unit driving step S220, when receiving the second phase signal $\varphi_2$, the CMIC controller 131 supplies a current to or takes a current out from the reference channel and the plurality of electrocardiogram measurement channels by driving the charge pumps of the charge pump unit 132 based on the common mode voltage detected in the common mode detection step S210, in response to the common mode control signal Sew.

In the EDO elimination step S230, the EDO elimination unit 120 eliminates an EDO by using a third phase signal $\varphi_3$. The third phase signal $\varphi_3$ is a phase signal for eliminating an EDO by driving the DAC 122 in order to zero the coupling capacitors in response to a switching operation of the upper switch 124a and the lower switch 124b in response to an upper capacitor offset elimination signal $S_{OR+}$ of the EDO elimination unit 120 and a lower capacitor offset elimination signal $S_{OR-}$ of the EDO elimination unit 120.

That is, in the EDO elimination step S230, in response to the switching operation of the upper switch 124a and the lower switch 124b, the output signal of the DAC 122 is transmitted to the upper capacitor 123a or the lower capacitor 123b, that is, a coupling capacitor, so that the coupling capacitor is previously charged with a voltage having a difference corresponding to an EDO prior to electrocardiogram measurement with respect to a channel electrocardiogram of which is to be measured, among the plurality of electrocardiogram measurement channels.

In the electrocardiogram measurement step S240, electrocardiogram of the plurality of electrocardiogram measurement channels is measured by using a fourth phase signal $\varphi_4$. The fourth phase signal $\varphi_4$ is a phase signal for collecting a signal for performing a digital code conversion through the ADC 150.

That is, in the electrocardiogram measurement step S240, when the fourth phase signal $\varphi_4$ is provided, a channel control signal $S_{CH,N}$ and a reference control signal Sir for each channel are activated. Electrocardiogram of each of the eight channels $CH_0$ to $CH_7$ is measured by differently distributing measurement times for each channel by using the TDM method in response to the channel control signal $S_{CH,N}$ and the reference control signal Ste.

As described above, in the present disclosure, the common mode interference cancellation unit 130 does not consistently operate, but operates for only permitted timing. That is, the common mode interference cancellation unit 130 does not reduce input impedance of an electrocardiogram signal because the common mode interference cancellation unit 130 operates only when receiving the first phase signal $\varphi_1$ and the second phase signal $\varphi_2$, that is, a preparation step between channel measurements.

Furthermore, in the present disclosure, the EDO elimination unit 120 also operates only when receiving the third phase signal $\varphi_3$, that is, a preparation step between channel measurements. Accordingly, since a value of a current corresponding to an EDO is previously charged by using the coupling capacitor, parallel elements can be minimized, and high input impedance can be satisfied.

The present disclosure may be modified in various ways and may have various embodiments. Specific embodiments have been illustrated in the drawings and specifically described in the detailed description. However, it should be understood that the present disclosure is not intended to be limited to the specific embodiments, but includes all of modifications, equivalents and/or substitutions included in the technical spirit and technical scope of the present disclosure.

All terms used herein, including technical terms or scientific terms, have the same meanings as those commonly understood by a person having ordinary knowledge in the art to which the present disclosure pertains, unless defined otherwise in the specification. Terms, such as those defined in commonly used dictionaries, should be construed as having the same meanings as those in the context of a related technology, and are not construed as ideal or excessively formal meanings unless explicitly defined otherwise in the application.

What is claimed is:

1. A time-division multiplexing (TDM)-based multi-channel electrocardiogram measurement apparatus robust against power line interference, comprising:
a multi-channel measurement unit comprising a plurality of electrocardiogram measurement channels and configured to measure electrocardiogram of the plurality of electrocardiogram measurement channels by using a TDM method;
a channel electrode offset (EDO) elimination unit configured to eliminate an EDO occurring in the multi-channel measurement unit;
a common mode interference cancellation unit configured to cancel interference attributable to a power line around a body;
an instrumentation amplifier configured to amplify an output signal of the multi-channel measurement unit; and
an analog-to-digital converter configured to convert an analog signal of the instrumentation amplifier into a digital signal,
wherein the EDO elimination unit comprises:
a DC-servo filter configured to receive an output of the analog-to-digital converter and to output a code signal comprising information corresponding to an EDO;
a digital-to-analog converter configured to convert an output signal of the DC-servo filter into an analog signal;
coupling capacitors disposed between the multi-channel measurement unit and the instrumentation amplifier; and
coupling switches configured to transmit the output signal of the digital-to-analog converter to the coupling capacitors, respectively.

2. The multi-channel electrocardiogram measurement apparatus of claim 1, wherein the multi-channel measurement unit comprises:
a reference channel disposed at a reference point which is a specific location of the body;
the plurality of electrocardiogram measurement channels disposed at a plurality of locations of body electrocardiogram of which needs to be measured; and
a multiplexer configured to receive electrocardiogram signals of the plurality of electrocardiogram measurement channels and to output one of the electrocardiogram signals.

3. The multi-channel electrocardiogram measurement apparatus of claim 2, wherein the multiplexer is configured to receive the electrocardiogram signals measured by differently distributing measurement times to the plurality of electrocardiogram measurement channels and output one of the electrocardiogram signals.

4. The multi-channel electrocardiogram measurement apparatus of claim 2, wherein:
the coupling capacitors comprise:
an upper capacitor disposed between the multiplexer and a first input stage of the instrumentation amplifier, and
a lower capacitor disposed between the reference channel and a second input stage of the instrumentation amplifier, and
the coupling switches comprise:
an upper switch configured to transfer the output signal of the digital-to-analog converter to the upper capacitor, and
a lower switch configured to transfer the output signal of the digital-to-analog converter to the lower capacitor.

5. The multi-channel electrocardiogram measurement apparatus of claim 4, wherein the upper capacitor and the lower capacitor are previously charged with voltages having a difference corresponding to the EDO prior to electrocardiogram measurement with respect to a channel electrocardiogram of which is to be measured, among the plurality of electrocardiogram measurement channels.

6. The multi-channel electrocardiogram measurement apparatus of claim 2, wherein the common mode interference cancellation unit comprises:
a common mode interference cancellation controller configured to receive a signal transmitted to an input stage of the instrumentation amplifier, detect a common mode (CM) voltage, and output a common mode interference cancellation control signal; and
a charge pump unit configured to be driven in response to the common mode interference cancellation control signal.

7. The multi-channel electrocardiogram measurement apparatus of claim 6, wherein the charge pump unit supplies a current to or takes a current out from the reference channel and the plurality of electrocardiogram measurement channels when a value of a common mode voltage at the input stage of the instrumentation amplifier is greater than a predetermined operating range.

8. An electrocardiogram measurement method using the electrocardiogram measurement apparatus according to claim 6, comprising:
a common mode detection step of detecting a common mode voltage at the input stage of the instrumentation amplifier by using a first phase signal;
a charge pump unit driving step of driving the charge pump unit by using a second phase signal when a value of the common mode voltage at the input stage of the instrumentation amplifier is greater than a predetermined operating range;
an EDO elimination step of eliminating an EDO through the EDO elimination unit by using a third phase signal; and
an electrocardiogram measurement step of measuring electrocardiogram of the plurality of electrocardiogram measurement channels by using a fourth phase signal.

9. The electrocardiogram measurement method of claim 8, wherein the common mode detection step comprises:
detecting the common mode voltage by receiving a signal transmitted to the input stage of the instrumentation amplifier, and
outputting the common mode interference cancellation control signal when the value of the common mode voltage is greater than the predetermined operating range.

10. The electrocardiogram measurement method of claim 9, wherein the charge pump unit driving step comprises supplying a current to or taking a current out from the reference channel and the plurality of electrocardiogram measurement channels by driving the charge pump unit in response to the common mode interference cancellation control signal.

11. The electrocardiogram measurement method of claim 8, wherein the EDO elimination step comprises previously charging the coupling capacitors with voltages having a difference corresponding to the EDO prior to electrocardiogram measurement with respect to a channel electrocardiogram of which is to be measured, among the plurality of electrocardiogram measurement channels, by transferring the output signal of the digital-to-analog converter to the coupling capacitors in response to a switching operation of the coupling switches.

12. The electrocardiogram measurement method of claim 8, wherein the electrocardiogram measurement step comprises measuring the electrocardiogram by differently distributing measurement times to the plurality of electrocardiogram measurement channels by using the TDM method.

* * * * *